United States Patent
Clevenger et al.

(10) Patent No.: US 7,041,525 B2
(45) Date of Patent: May 9, 2006

(54) THREE-DIMENSIONAL ISLAND PIXEL PHOTO-SENSOR

(75) Inventors: Lawrence A. Clevenger, LaGrangeville, NY (US); Louis L. Hsu, Fishkill, NY (US); Carl J. Radens, LaGrangeville, NY (US); Li-Kong Wang, Montvale, NJ (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 10/751,205

(22) Filed: Jan. 2, 2004

(65) Prior Publication Data

US 2004/0227061 A1    Nov. 18, 2004

Related U.S. Application Data

(62) Division of application No. 09/922,077, filed on Aug. 6, 2001, now Pat. No. 6,720,595.

(51) Int. Cl.
*H01L 21/66* (2006.01)
*H01L 21/00* (2006.01)

(52) U.S. Cl. .................................. 438/48; 438/81
(58) Field of Classification Search ................ 257/292, 257/291, 654, 656
See application file for complete search history.

(56) References Cited

U.S. PATENT DOCUMENTS

| 5,061,652 | A | * | 10/1991 | Bendernagel et al. | ....... 438/104 |
| 6,021,050 | A | | 2/2000 | Ehman et al. | |
| 6,111,305 | A | * | 8/2000 | Yoshida et al. | ............. 257/656 |
| 6,133,615 | A | | 10/2000 | Guckel et al. | |
| 6,210,537 | B1 | | 4/2001 | Murphy et al. | |

FOREIGN PATENT DOCUMENTS

| JP | 402273926 | 11/1990 |
| JP | 407058439 | 3/1995 |

* cited by examiner

*Primary Examiner*—Zandra V. Smith
*Assistant Examiner*—Kiesha Rose
(74) *Attorney, Agent, or Firm*—Gibb I.P. Law Firm, LLC; Robert M. Trepp, Esq.

(57) ABSTRACT

A method and structure for a photodiode array comprising a plurality of photodiode cores, light sensing sidewalls along an exterior of the cores, logic circuitry above the cores, trenches separating the cores, and a transparent material in the trenches is disclosed. With the invention, the sidewalls are perpendicular to the surface of the photodiode that receives incident light. The light sensing sidewalls comprise a junction region that causes electron transfer when struck with light. The sidewalls comprise four vertical sidewalls around each island core. The logic circuitry blocks light from the core so light is primarily only sensed by the sidewalls.

15 Claims, 7 Drawing Sheets

THREE-DIMENSIONAL ISLAND PIXEL PHOTO-SENSOR

CROSS-REFERENCE TO RELATED APPLICATIONS

This application is a division of U.S. application Ser. No. 09/922,077 filed Aug. 6, 2001 now U.S. Pat. No. 6,720,595.

BACKGROUND OF THE INVENTION

1. Field of the Invention

The present invention generally relates to photo-sensor arrays and more particularly to a unique three-dimensional pixel structure that significantly improves pixel packing density.

2. Description of the Related Art

Semiconductor photosensors have been found in a wide variety of applications. These include position measurement, CMOS imagine sensors, motion detector, image capturing and velocity measurement. One key application of these devices however is for optical-fiber communication.

The basic photo sensing mechanisms, as summarized by S. M. Sze in the text book of Physics of Semiconductor Devices, p. 743 (incorporated herein by reference), are: (1) carrier generation by incident light, (2) carrier transport and/or multiplication by some sort of current-gain devices, and (3) interaction of current and IC circuits to provide output signals. A well-designed photo-sensor provides high sensitivity at operating wavelengths, high response speed, and minimum noise. It is desirable that photo-sensor chips be small in size, reliable under operating conditions, and operated at low power.

From a device aspect, photo-sensors can be presented in many different types, such as p-i-n diode, p-n diode, metal semiconductor diode, metal-i-n diode, etc. In general, p-n diodes have a lower response speed than p-i-n diodes (described in greater detail below). This is because the generated photocurrent consists of large portions of diffusion current and small portions of drift current due to thin depletion region. At long wavelengths, the required absorption depth becomes very long which causes performance of p-n diodes to degrade further.

One of the reasons for the increased performance of p-i-n diodes is that they include a depletion region (or the intrinsic layer) which has a thickness that allows p-i-n diodes to be tailored to optimize quantum efficiency and frequency response. The basic photosensing mechanism of a p-i-n diode has light absorption in the depletion (or i-layer) region that produces hole-electron pairs which will be separated by an applied electric field. The diode is reverse biased, so that electron "holes" drift to the p terminal, which is tied to ground, while electrons drift to the n terminal, which is tied to a positive voltage. This results in higher current flow in the external circuit than that of the p-n diode sensors due to large drift space.

If metal is used to form photosensors, usually it has to be very thin (10 to 20 nm) so that it is semi-transparent to the incident light. In general, metal is also highly reflective and an anti-reflective coating (e.g., 50 nm of ZnS) is necessary to enhance quantum efficiency.

Another application for photosensors is use as an image sensor. Complementary metal oxide semiconductor (CMOS) image sensors have advantages such as low-cost, low-power, and a high level of integration. CMOS image sensor can be used in digital cameras or devices such as motion detectors. In general, each pixel of CMOS image sensor comprises ⅕ circuit area, and ⅘ diode area. Further, in order to ensure sufficient total photon flux, conventional two-dimensional p-n photosensors are inherently designed with large spacing. Therefore, conventional CMOS image sensors have relatively poor pixel density and there is a need to increase the pixel density.

SUMMARY OF THE INVENTION

In view of the foregoing and other problems, disadvantages, and drawbacks of the conventional photo-sensor arrays, the present invention has been devised, and it is an object of the present invention to provide a structure and method for boosting pixel density of a photo-sensor array. Pixel density is defined as number of pixels which can be packed in a unit chip area. The second object of the invention is to provide a unique three-dimensional pixel structure so that pixel packing density can be significantly improved. Another object is to provide optimize the sensor's quantum efficiency. A further object is to use a conductive polymer to fill in the gaps in the sensor array and to improve reverse biasing of the p terminal of each photo diode without blocking the light.

In order to attain the object(s) suggested above, there is provided, according to one aspect of the invention a photodiode array comprising a plurality of photodiode cores, light sensing sidewalls along an exterior of the cores, logic circuitry above the cores, trenches separating the cores, and a transparent material in the trenches.

With the invention, the sidewalls are perpendicular to the surface of the photodiode that receives incident light. The light sensing sidewalls comprise a junction region that causes electron transfer when struck with light. The sidewalls comprise four vertical sidewalls. The core comprises a n+ core and the sidewalls comprise p+ sidewalls. The logic circuitry blocks light from the core.

More specifically, the island pixels have an n+ core having a cube shape, an intrinsic layer surrounding sides of the n+ core, a p+ layer surrounding sides of the intrinsic layer and at least one transistor above the n+ core. There is also an n-well between and connecting the n+ core and the transistor. The p+ layer comprises a p-type doped layer having a low doping concentration and the n+ core comprises an n-type low doped layer.

An anti-reflective coating surrounds the sides of the p+ layer and a transparent material is adjacent the anti-reflective coating. There are also wiring levels above the transistor and the transparent regions. The wiring levels include transparent regions above the transparent material.

The light absorption sidewall regions are perpendicular to the surface of the pixel that receives the incident light, while conventional light absorption regions are made parallel to the pixel surface. With the invention, the upper surface of the island maintains the necessary logic circuitry and the upper surface is not a region where substantial amounts of light are absorbed. To the contrary, with the invention, the openings surrounding each pixel island allow angled light beams to directly strike the vertical light absorption surfaces. Further, light beams that are directly perpendicular to the upper surface of the array of are reflected from the trenches surrounding each of the islands to one of the adjacent vertical light absorption regions. Also, the light beams will produce multiple internal reflections inside the pixel island, which also improves the diode quantum efficiency.

Since the light absorption regions are perpendicular to the upper surface of the array, they do not consume any substantial amount of the two-dimensional area of the upper surface of the array. Only logic circuitry and the trenches between the pixel islands consume two-dimensional area of the upper surface of the array. Thus, the inventive three-dimensional photo-diode island design realizes an increase in sensor packing density.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As shown above, there is a need to increase pixel density in image sensor arrays. The invention increases pixel density with a new photo-sensor pixel structure that has the p+ diffusion of the p-i-n diode formed at the outer edges of pixel islands. Correspondingly, the n+ of the p-i-n diode is formed in the core of the island, and the i layer is the middle ring formed between the outer edge of p+ layer and the n+ core. In the inventive structure, the light absorption regions are located along the vertical walls of the island (e.g, perpendicular to the upper surface of the array). By placing the light absorption regions along the vertical walls of the three-dimensional island, the area occupied by the light absorption regions is increased dramatically resulting in a substantial improvement in diode quantum efficiency.

Figure 12:
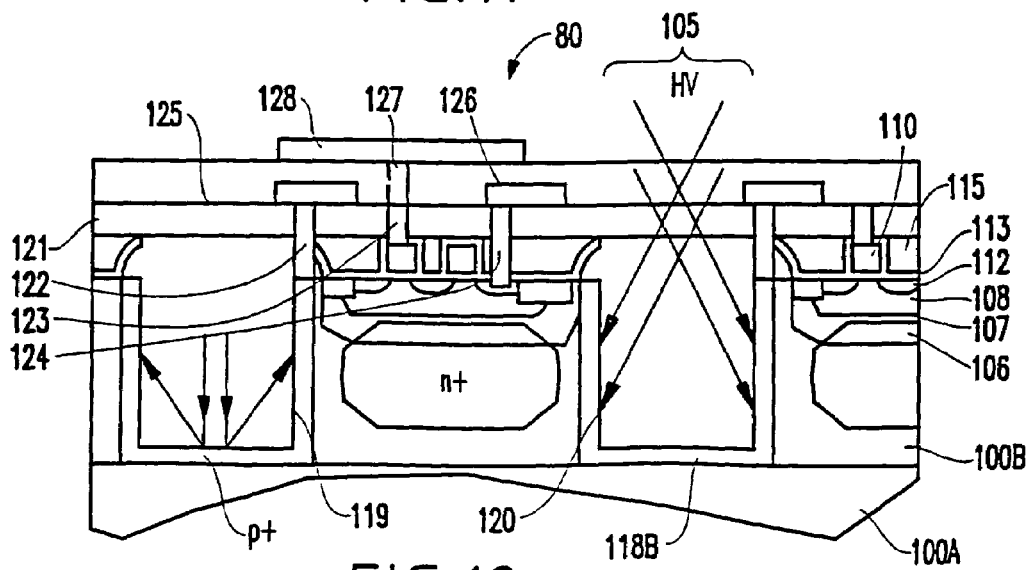
FIG. 12 is a schematic cross-sectional diagram of a finished photo-sensor.
Figure 13A:
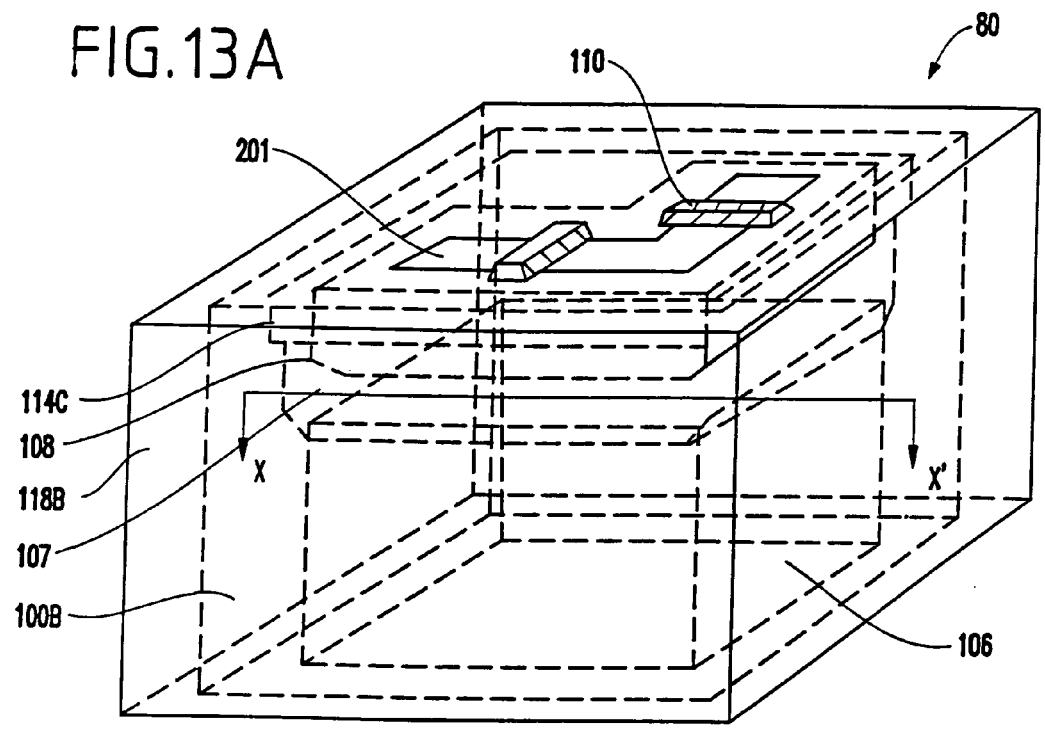
FIG. 13A is a schematic perspective diagram of a photo-sensor.

As shown in FIGS. 12 and 13A, that are discussed in greater detail below, the light absorption regions are perpendicular to the upper surface of the pixel (as opposed to being parallel to the upper surface of the array, as is done conventionally). With the invention, the upper surface of the island maintains the necessary logic circuitry and the upper surface is not a region where substantial amounts of light are absorbed. To the contrary, with the invention, the openings surrounding each pixel island allow angled light beams to directly strike the vertical light absorption surfaces. Further, light beams that are directly perpendicular to the upper surface of the array of are reflected from the trenches surrounding each of the islands to one of the adjacent vertical light absorption regions. Also, the light beams will produce multiple internal reflections inside the pixel island, which also improves the diode quantum efficiency.

Figure 1:
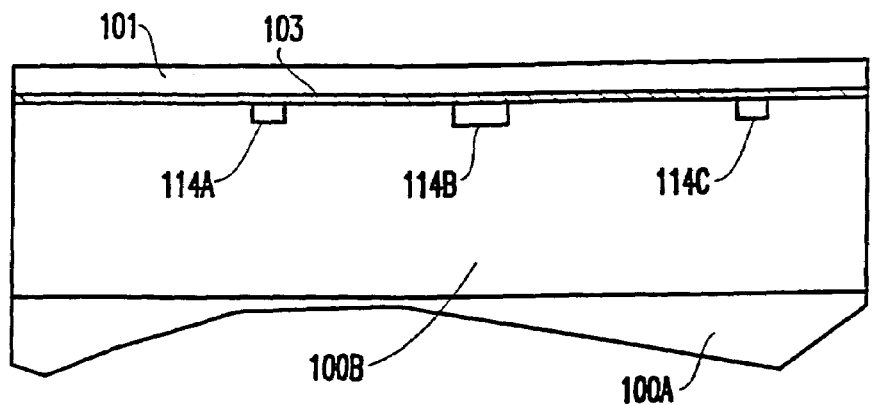
FIG. 1 is a schematic cross-sectional diagram of a partially finished photo-sensor.

Since the light absorption regions are perpendicular to the upper surface of the array, they do not consume any substantial amount of the two-dimensional area of the upper surface of the array. Only logic circuitry and the trenches between the pixel islands consume two-dimensional area of the upper surface of the array. Therefore, the inventive pixel islands only consume approximately 25% of the two-dimensional surface area of the upper surface of the array to provide the same amount of light absorption area of conventional horizontal light absorption regions. Thus, the inventive three-dimensional photo-diode island design realizes a 4× increase in sensor packing density Referring now to the drawings, FIGS. 1–12 show one exemplary embodiment of making the inventive pixel island. FIG. 1 starts with a p-type or n-type silicon wafer 100A. An intrinsic epitaxially grown silicon layer 100B (the intrinsic "i-layer") is grown on top of the substrate. The thickness of the intrinsic layer 100B can be any size desired, and preferably is about 1 to 2.5 um. The intrinsic layer 100B can comprise pure epitaxial silicon or a low-doped p-layer or n-layer. The doping of the intrinsic layer 100B would be greater than no doping at all and less than the amount of doping provided to the p-layer 118B and the n-type core 106, discussed below. For example, the doping concentration of the intrinsic layer 100B is preferably in the range 1e10 to 1e12 $cm^3$.

A mask and etching process is used to form shallow trench 114A–114C isolation regions. A sacrificial oxide layer 103 (which is preferably about 20 nm in thickness) is grown followed by a chemical vapor deposition (CVD) formed nitride layer 101 (e.g, SiN, Si, $N_xO_y$) with a preferable thickness about 350 nm (although any thickness can be used, depending upon design requirements).

In the drawings, the same features are identified with the same identification numbers. In some drawings, some of the identification numbers are omitted to make the drawings more clear; However, such structures can be easily identified by referring to previous or succeeding drawings.

Figure 2:
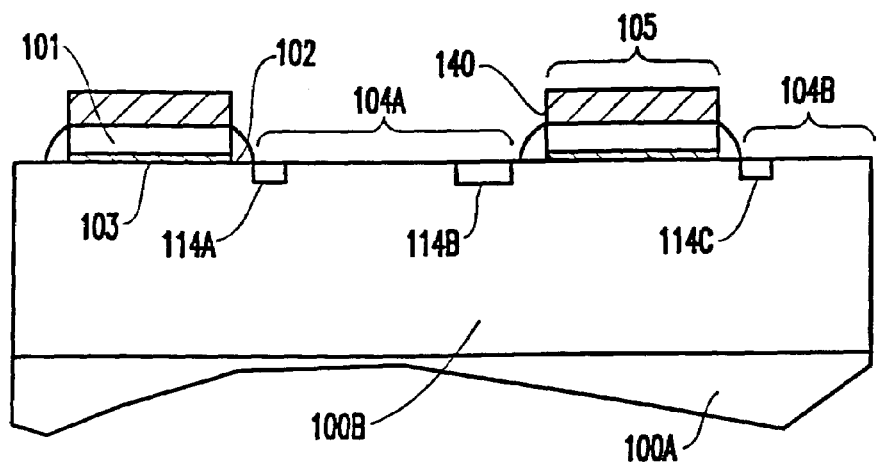
FIG. 2 is a schematic cross-sectional diagram of a partially finished photo-sensor.

In FIG. 2 another mask 140 is used to pattern the sacrificial oxide 103 and nitride 101 to define pixel device areas 104A and 104B by reactive ion etching (RIE). The unetched portions of the nitride 101 that are protected from the RIE by the mask 140 will become the gaps 105 between the pixels. After the etching, nitride sidewall spacers 102 are formed along edges of the unetched nitride patterns 101. The gaps 105 are patterned such that each pixel 104A, 104B preferably has a square shape.

Figure 3:
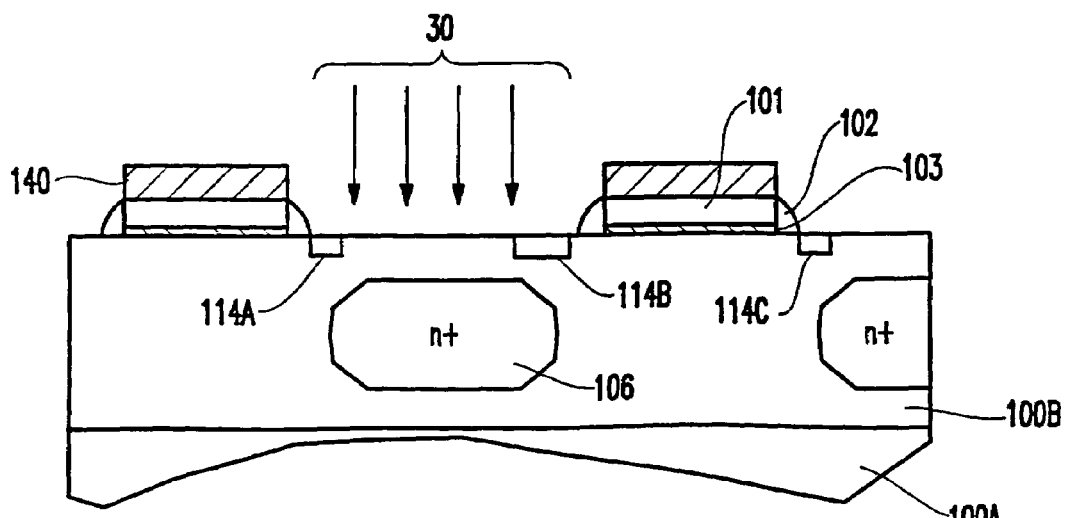
FIG. 3 is a schematic cross-sectional diagram of a partially finished photo-sensor.

Next, as shown in FIG. 3, a high energy, deep ion implant is carried out to form buried n+ region 106 inside the pixel regions. For example, Arsenic or Phosphor could be implanted to a concentration of 10e15 to 10e17 $cm^3$. While any dimensions can be used depending upon the specific application, in one embodiment, the top surface of buried n+ region 106 is about 350 nm to 500 nm below the silicon surface. The n+ implant forms a cube structure that can be any design size and, in one preferred embodiment, 1 um$^2$ to 10 um$^2$.

Figure 4:
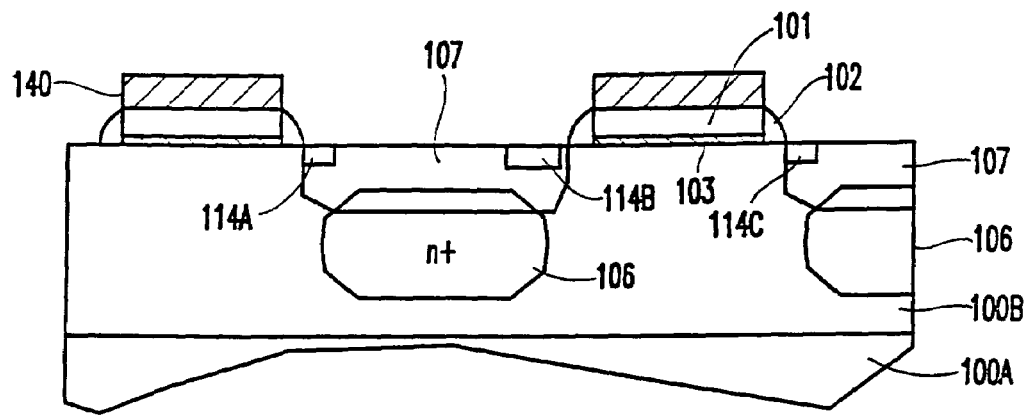
FIG. 4 is a schematic cross-sectional diagram of a partially finished photo-sensor.

Using the existing mask 140 an n-type implant (e.g., Arsenic, Phosphor, etc.) is subsequently implanted to form n-well 107, as shown in FIG. 4. The n-well implant 107 preferably intersects the buried n+ region 106 and make an electrical connection with the n+ cube region 106. The buried n+ region 106 becomes the n terminal of the p-i-n diode in the final structure.

Figure 5:
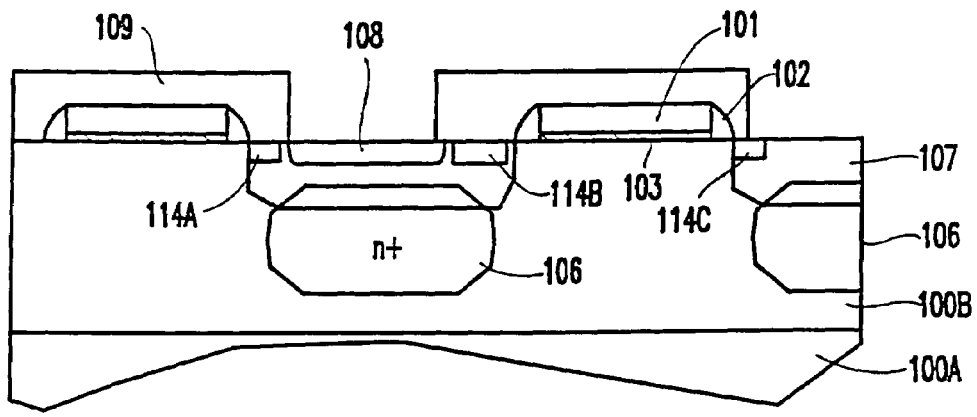
FIG. 5 is a schematic cross-sectional diagram of a partially finished photo-sensor.
Figure 6:
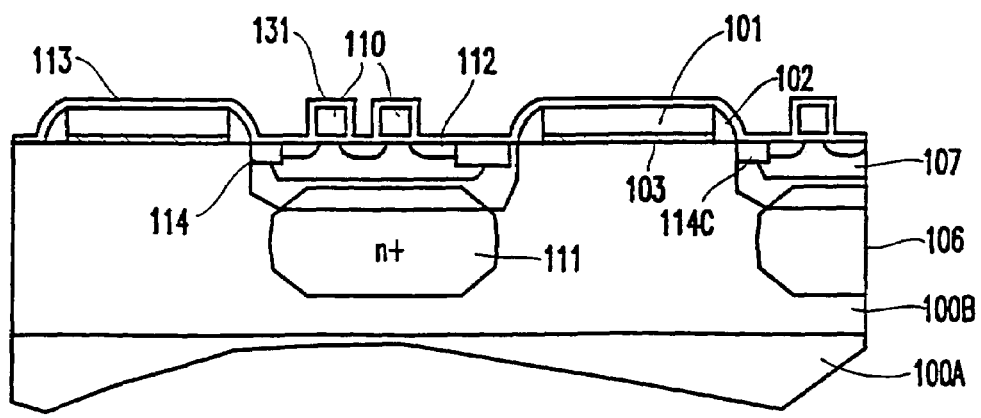
FIG. 6 is a schematic cross-sectional diagram of a partially finished photo-sensor.

In FIG. 5, the previous mask 140 is removed and a new mask 109 patterned. This new mask 109 is different than the previous mask 140 in that it protects not only the nitride regions 101, but also the sidewall spacers 102 and the shallow trench isolation regions 114A–114C. Using the mask 109, a p-well region 108 is formed with a p-type implant (e.g., Boron, BF$_2$, etc. in concentrations of 10e14 to 10e16 cm$^3$). All the nMOS structures (e.g., transistors, etc.) of the pixel device can be built inside the p-well. As shown in FIG. 6, a conventional gate oxidation and a CVD polysilicon deposition are performed to form gate oxide 111 and gate conductors 110, respectively. With respect to the patterning of the gate conductors 110, a composite protective layer such as Al$_2$O$_3$ +oxide 131 is deposited over the gate conductor polysilicon layer.

Well-known conventional source/drain implants are made and annealing is carried out to activated the dopants and form the source/drain structures 112. In order to further reduce the contact resistance from the source/drain structures 112 to the buried n+ cube 106, an optional diffusion implant (Arsenic, Phosphor, etc. in concentrations of 10e14 to 10e16 cm$^3$) may be used (not shown). This shallow diffusion implant makes the area beneath the source and drain regions more conductive to allow good electrical contact to the n+ cube 106. The above processing forms transistors, each having a gate 110, gate oxide 111, source/drain regions 112, and p-well region 108. The processing steps used to form, and the logical operation performed by these transistors and other devices is well known to those ordinarily skilled in the art field of photodiodes and is not discussed in detail herein so as not to unnecessarily obscure the salient features of the invention.

Figure 7:
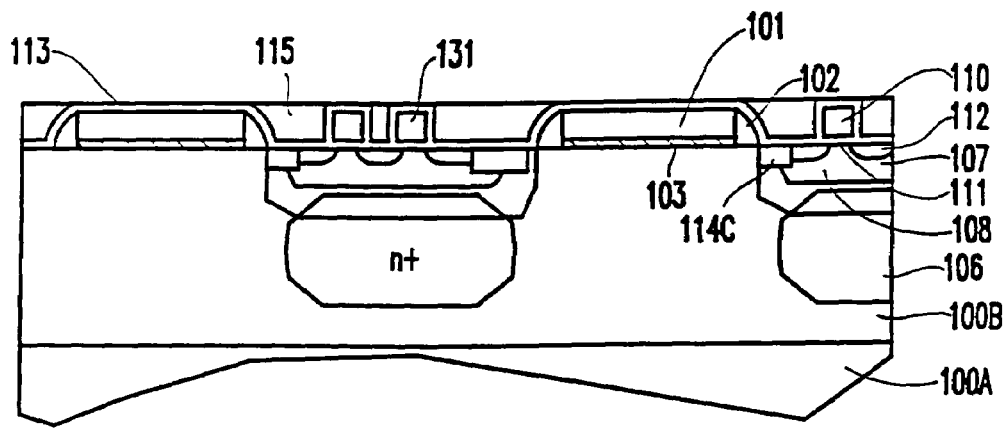
FIG. 7 is a schematic cross-sectional diagram of a partially finished photo-sensor.

After these devices are formed, a protective nitride layer 113 is deposited on the wafer surface. Next, as shown in FIG. 7, a CVD oxide layer 115 is deposited and polished back (e.g., using chemical mechanical polishing—CMP) to the nitride layer 113, so that CVD oxide 115 protects these devices during the following RIE process. The planarization process is continued until nitride debris is detected. The nitride debris indicates that the upper portion of the nitride layer 113 is exposed. This polishing process leaves a portion of the oxide layer 115 to protect the upper portion (e.g., transistors) of the pixel island being formed. By exposing the upper portion of the nitride layer 113, chemical etches that selectively attack nitride and do not substantially affect oxides can be used to form the trenches that will surround the pixel islands, as described below. Such processing does not require the formation or alignment of masks and is therefore, self-aligned.

Figure 8:
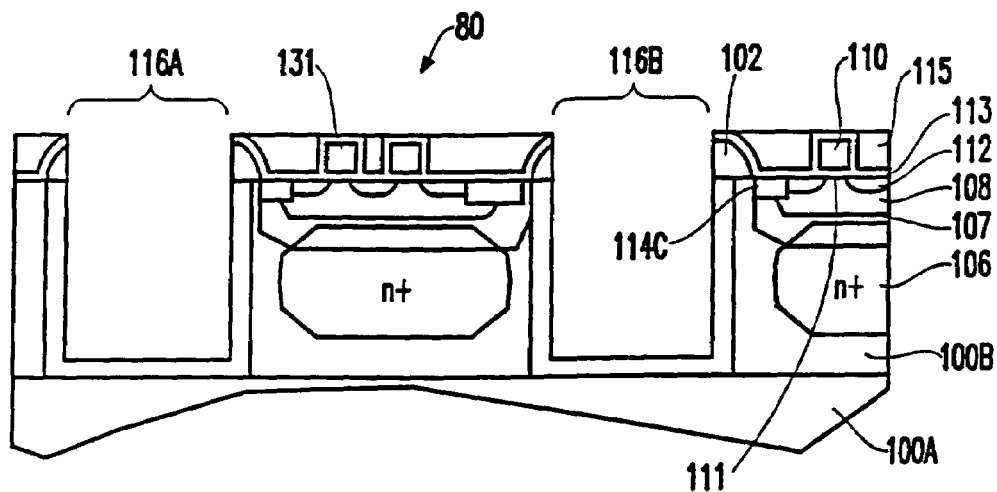
FIG. 8 is a schematic cross-sectional diagram of a partially finished photo-sensor.

In FIG. 8, the invention selectively removes the exposed nitride layer 113 and 101 using a directional dry etch (e.g., CF$_4$, etc.). The etch rate ratio of nitride to oxide with CF$_4$ is, for example, 30 to 100:1. This removes the nitride materials 101, 113 above the regions that will become the trenches surrounding the pixel islands. The thin oxide layer 103 is then removed. This also removes a portion of the oxides 115; However, the Al$_2$O$_3$ layer 131 (discussed above) stays on top of the gate stacks to protect the gate areas. Alternatively, if the protective Al$_2$O$_3$ layer is not used, a mask can be used to protect the structures on top of the pixel island and define the trenches.

Then an etch (e.g., Chlorine based RIE anisotropic etch, etc.) is performed to etch the silicon 100B so as to form the trenches 116A, 116B. This etching process may also etch away a portion of the protective Al$_2$O$_3$; However, the gate oxide layer 111 will remain to protect the gate conductor 110. The etch rate ratio of silicon to oxide in this etching process is about 30:1 to 50:1. Such trenches 116A and 116B are formed and define the pixel islands 80 that include the buried n+ cube 106 and overlying devices. The depth of the trenches 116A, 116B is preferably equivalent to that of the buried n+ region 106 and is controlled by adjusting the timing and power of the chlorine etch.

Figure 9:
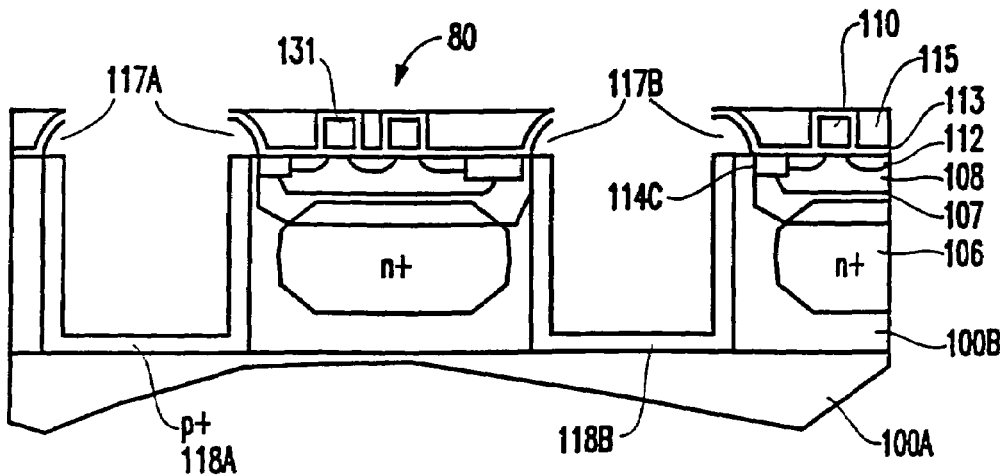
FIG. 9 is a schematic cross-sectional diagram of a partially finished photo-sensor.

The spacer nitride 102 is removed (e.g., CF$_4$ etch) to form gaps 117A, 117B and a p+ type implant (e.g., Boron, BF$_2$, etc. at a concentration of 1e15 to 1e18 cm$^3$) is carried out to form a uniform p+ layer 118A and 118B, as shown in FIG. 9. Preferably, an angled implant, and tilt implant techniques are used to guarantee uniform trench sidewall doping of the p+ layer 118A and 118B. The p+ implant layer 118A, 118B preferably extends into the exposed sidewall portions of the silicon substrate 100B along the vertical surfaces of the trenches 116A, 116B such that the thickness of the p+ implant layer 118A, 118B is equal to or greater than the remaining portion of the silicon 100B between the p+ layer 118A, 118B and the n+ cube 106. These layers 118A, 118B are the p+ terminal of the p-i-n diode. The p+ layer 118A, 118B should not overlap the cube n+ region 106. Instead, there should be enough of the silicon substrate 100B remaining to insulate the p+ layer 118A, 118B from the cube n+ region 106. Therefore, even after annealing, a layer gap of the substrate 100B remains between p+ and n+ regions to form the i layer. Thus, as shown in FIG. 9, the p-i-n diode is shown respectively by regions 118B, 100B, and 106. Alternatively, a p-n pixel island device can be formed by simply driving the p+ implant further into the sidewalls of the trenches to eliminate the intrinsic layer 100B. However, the preferred embodiment is a p-i-n pixel island structure.

Figure 10:
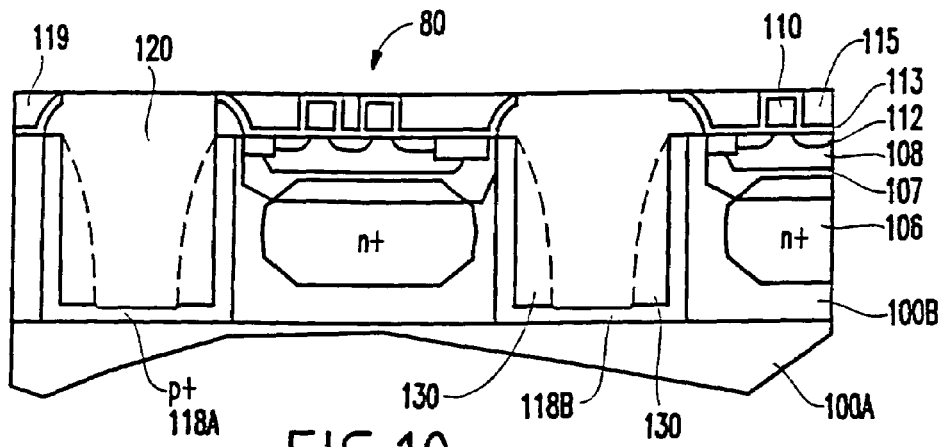
FIG. 10 is a schematic cross-sectional diagram of a partially finished photo-sensor.

In order to improve the quantum efficiency of the photodiode a 50 nm of anti-reflective coating 119, such as ZnS, etc., is coated (e.g., using CVD process) on all surfaces as shown in FIG. 10. While the anti-reflective coating 119 is helpful in promoting light absorption along the vertical surfaces of the trench (trench walls), the anti-reflective coating 119 should not remain along the bottom of the trench because it is desirable to allow light rays that strike the bottom of the trench to reflect back toward the trench sidewalls. Therefore, the invention forms sidewall spacers 130 of a transparent conductive polymer. The conductive polymer 130 can be poly phenylenevinylene, poly pyrrole, polythiophene derivatives, or any other electrically conductive and optically transparent polymer. The sidewall spacers are formed by depositing the transparent polymer 130 and then performing a directional etch that removes material from horizontal surfaces and allows material to remain on vertical surfaces. Once the sidewall spacers 130 are formed, a selective etch is used to remove the anti-reflective coating 119 from the areas not protected by the spacers. Therefore, this selective etch removes the anti-reflective coating 119 from the bottom of the trench. This etching process leaves the underlying silicon 100B at the bottom of the trenches as a fairly roughened surface that tends to reflect light beams in many directions and preferably toward the vertical surfaces of the trench (the photo sensing regions of the island). After the anti-reflective coating 119 is removed from the bottom of the trenches, the remainder of the trench is filled with the same transparent polymer 120 used to form the spacers 130. Then, the structure is planarized. A low-temperature (e.g., 250° C.–350° C.) annealing process is then applied to cure the polymer film 120.

Figure 11:
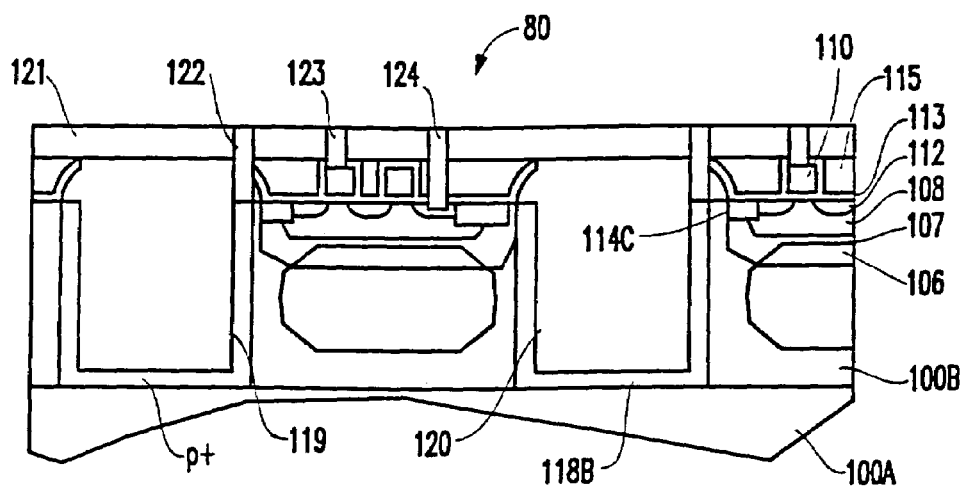
FIG. 11 is a schematic cross-sectional diagram of a partially finished photo-sensor.

In FIG. 11, an insulating layer 121 (e.g., CVD oxide, polymer, diamond, low-k dielectric, etc.) is deposited and via openings are patterned therein using well-known techniques. Conductive contacts (e.g., tungsten, titanium, doped polysilicon, etc.) to the p+ terminal 122, gate 123 and source and drain 124 are made through the vias in the insulating layer 121. Then, in FIG. 12, the first patterned metal wiring layer 126 is formed using well-known deposition/patterning techniques (e.g., damascene processing). In layer 126, the wires are patterned so as to minimize their passage over the gap area 105 so to not block light from the sidewalls of the p layer 118B of the photodiodes. Another insulating layer 125, second group of conductive studs 127, and third patterned metal layer 128 are formed subsequently using the same or similar well-known processes. At this point, the photodiode and pixel circuit fabrication processes are complete.

Figure 13B:
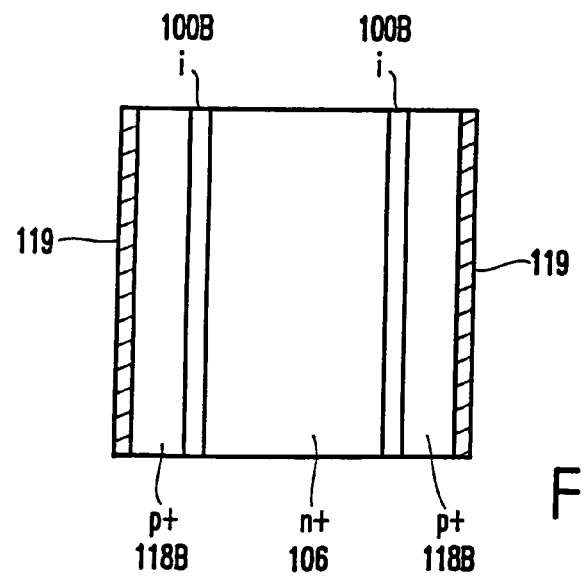
FIG. 13B is a schematic cross-sectional diagram of a photo-sensor.

FIG. 13A illustrates the cube structure 80 shown in FIG. 12 in perspective view. On the surface of the pixel, the active device region 201 (that includes the transistors 110, 112, etc.) is bounded by a shallow trench isolation 114C. NMOS devices are formed by gates 110 and the source drain diffusion regions residing in the p-well 108. The p-well 108 is inside the n-well 107, which intersects the buried n+ region 106. The outer layer of the cubical island 80 is p+ layer 118B, the middle ring region 100B is the intrinsic layer, while the center core region 106 is the n+ buried diffusion. A further simplified cross-sectional view along line X—X' in FIG. 13A illustrating p-i-n diodes (118B, 100B, 106) is shown in FIG. 13B. This drawing also depicts the anti-reflective coating films 119.

This p-i-n diode (118B, 100B, 106) has a unique shape that provides four vertical light sensing regions (the sides of the cubes) for each pixel, which improves the photo diode response speed. The structure increases the contact surface between p+, i and n+ layers, and also make these surfaces accessible by incident light (or photons). Therefore, the photodiode response speed (which is determined by the efficiency of electron-hole pair generation at the interface) is improved.

With the inventive structure, the light strikes the device junction at many angles to create multiple reflections inside the island 80. This structure greatly increases the effective absorption depth of photons and at the same time keeps carrier transit distance small. The inventive three-dimensional (cube) photodiode structure provides more surfaces (e.g., 4 vertical surfaces) and more angles for light to reflect within each pixel than does the conventional structure that includes only a horizontal light adsorption region. The increased unit area creates more electron and hole carriers. These carries are transferred more quickly to the respective junction area due to large surface area of the interface and the carrier transit distance being smaller than that of the conventional structure. This also results in the photo diode having a higher response speed. As the result of light projecting on the sidewalls of trench surface 120, and light being reflected from the roughened bottom of the trenches to the sidewalls of the trench surface 120, as shown by arrows in FIG. 12, electron-hole pairs created in the i-layer 100B will be shifted to either p+ or n+ junction. More specifically, light absorption in the depletion (or i-layer) region 100B produces hole-electron pairs which will be separated by the applied electric field in the p and n layers 118B, 106. The diode is reverse biased, so that electron "holes" drift to the p terminal 118B, which is tied to ground, while electrons drift to the n terminal 106, which is tied to a positive voltage. Since the p+ and n+ nodes are reverse biased, the electrons will be attracted to the p+ junction layer 118B while holes will be attracted to the n+ junctions 106 to create useful photo-current.

Figure 14A:
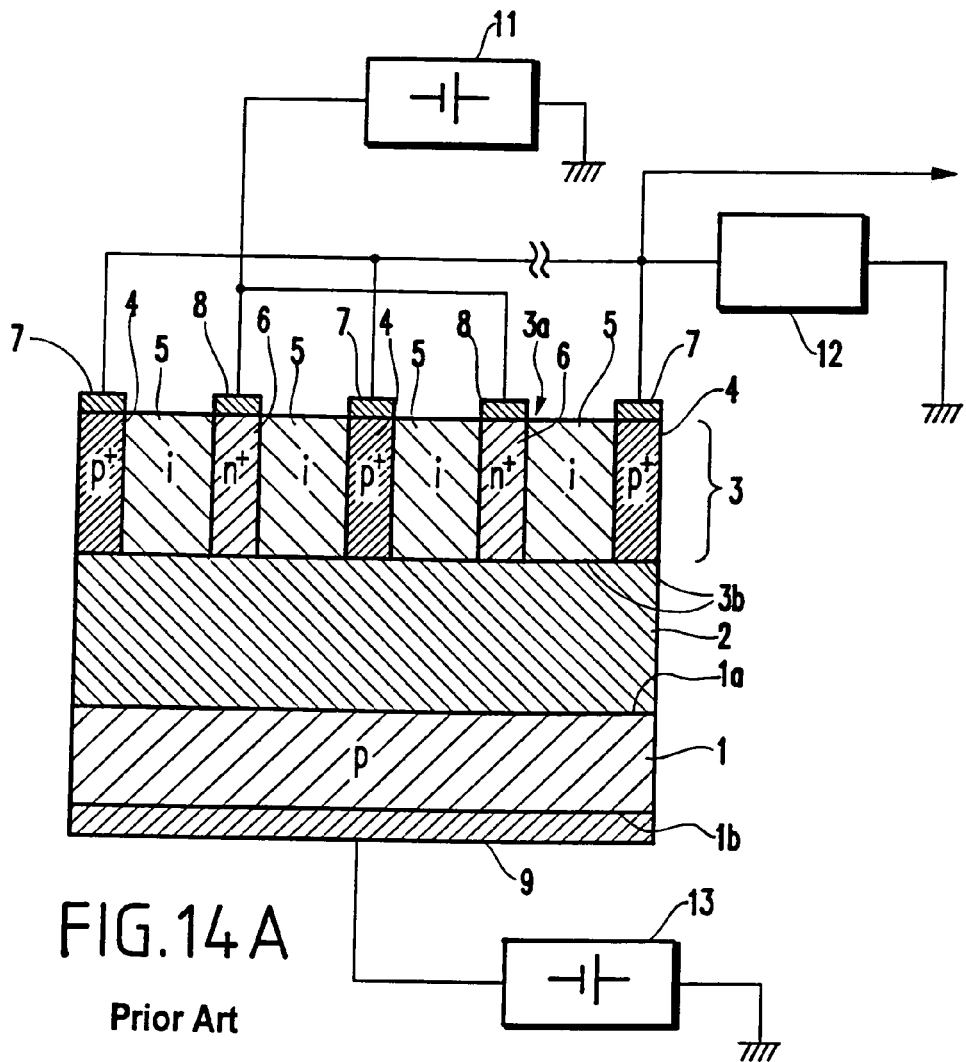
FIG. 14A is a schematic top-view diagram of a photo-sensor.
Figure 14B:
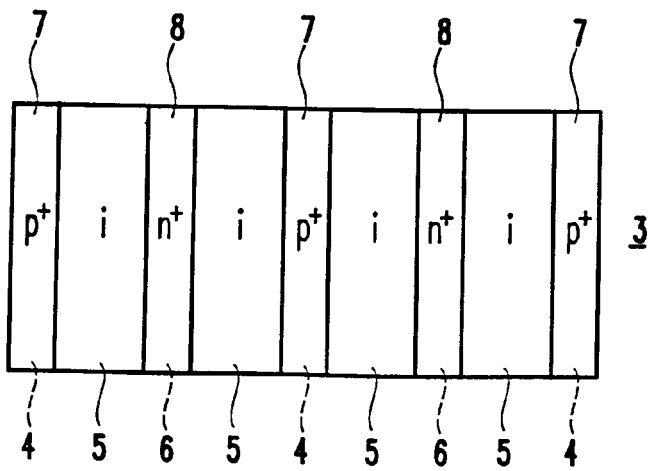
FIG. 14B is a circuit schematic diagram of a photo-sensor.

To contrast the invention, an example of a conventional flat (two-dimensional) photodiode having only a horizontal light sensing area is shown in cross-sectional and top views in FIGS. 14A and 14B, respectively. A more complete example of a conventional p-i-n photodiode is discussed in U.S. Pat. No. 6,111,305, which is incorporated herein by reference. This structure has many advantages when compared to p-n structures, such as large dynamic range and true array random accessibility. However, the drawbacks of the structure shown in FIGS. 14A–14B are slow response at low light intensity, small output voltage swing, and low noise immunity.

More specifically, in the conventional p-i-n semiconductor photodetector, on a main surface 1a of a single crystal semiconductor substrate 1 made of a p-type single crystal is arranged a single crystal semiconductor layer 3 made of a single crystal and 50 to 400 nm thick through an insulator film 2. In practice, this structure is fabricated by implantation of oxygen ions. For example, oxygen ions are implanted into a single crystal semiconductor substrate 1 such that an insulator film 2 is formed so as to leave undoped single crystal semiconductor substrate 1 and single crystal semiconductor layer 3 lying thereunder and there over, respectively. The insulator film 2 inevitably has a relatively large thickness as large as 110 nm.

Also, there are formed in the single crystal semiconductor layer 3 a p-type semiconductor region 4, an i-type semiconductor region 5, and an n-type semiconductor region 6, which extend between a main surface 3a of the single crystal semiconductor layer 3 on a side opposite to the insulator film 2 and a main surface 3b opposing to the main surface 3a such that the semiconductor regions 4, 5 and 6 are arranged in a pattern of stripes of 2 um, 3 um, and 2 um, respectively, wide in a sequence in which the i-type semiconductor region 5 is present between the p-type semiconductor region 4 and n-type semiconductor region 6 as seen both from the main surface 3a and from the main surface 3b of the single crystal semiconductor layer 3.

Further, on the main surface 3a of the single crystal semiconductor layer 3a are attached biasing electrodes 7 and 8 in ohmic contact to the p-type and n-type semiconductor regions 4 and 6, respectively. In addition, on a main surface 1b of the single crystal semiconductor substrate 1 (which is opposite to the main surface 1a on which the insulator film 2 is formed) there is provided an electrode 9 as a depleting electrode.

In the conventional p-i-n semiconductor photodetector shown in FIGS. 14A and 14B, connecting an anode of the biasing power source 11 to the biasing electrode 8 attached to the n-type semiconductor region 6, the biasing electrode 7 attached to the p-type semiconductor region 4 to the ground through the load 12, and a cathode of the depleting power source 13, whose anode is grounded, to the depletion electrode 9, results in the formation of a depleted layer 2 which extends from the side of the single crystal semiconductor substrate 1 to the side of the i-type semiconductor region 5 of the single crystal semiconductor layer 3 with a dimension depending on the value of a voltage for depletion obtained from the depleting power source 13. This occurs because the cathode side of the depleting power source 13 is connected to the depleting electrode 9 between the depleting electrode 9 and the ground. For this reason, use of a power source, as the depleting power source 13, which can provide a voltage sufficient to deplete all over the i-type semiconductor region 5 will allow depletion of the i-type semiconductor region 5 entirely.

If the i-type semiconductor region 5 is fully depleted as described above, there is formed in the depleted i-type semiconductor region 5 a drift electric field which drifts the carriers therein in the direction bridging the p-type semiconductor region 4 and n-type semiconductor region 6.

However, in the structure shown in FIGS. 14A–14B, light is incident only on the upper layer of the structure (e.g., on the surface shown in FIG. 14B). Therefore, the structure shown in FIGS. 14A–14B is referred to herein as a "flat" 2-dimensional photodetector because the light sensing area is limited to the horizontal two-dimensional upper surface of the structure (e.g., the area that is parallel to the upper surface of the pixel array). To the contrary, with the inventive structure shown in FIGS. 12 and 13A, light is incident on the four sides of the pixel cube (e.g., the sides that are perpendicular to the upper surface of the pixel array) and the inventive structure is therefore referred to as a three-dimensional pixel island.

Figure 15:
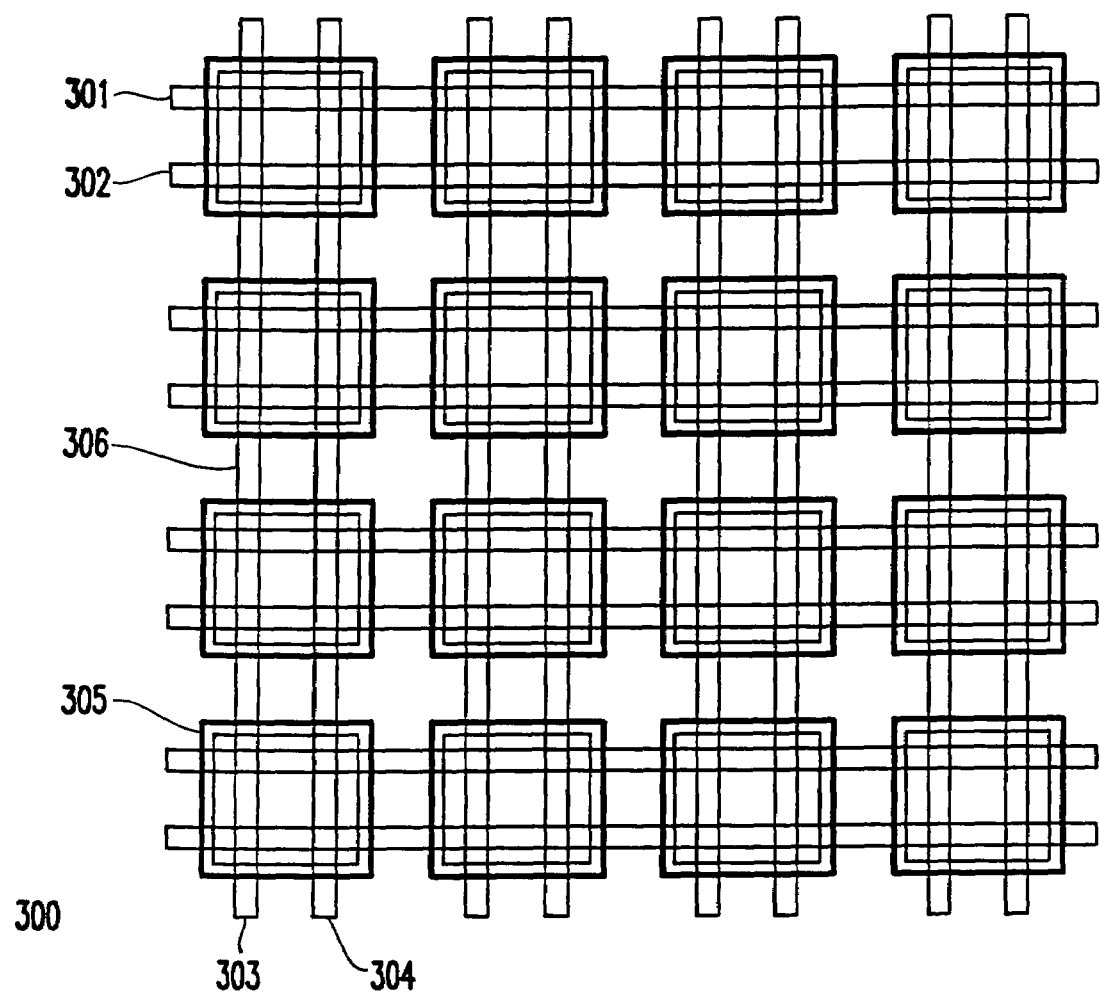
FIG. 15 is a schematic top-view diagram of a photo-sensor array.

Finally, an example of a 4×4 photo sensor array 300 used with the invention is shown in FIG. 15. Within each pixel there are two vertical wires 303 and 304, and two horizontal wires 301 and 302. An anti reflective coating 305 is shown formed on the outline of each cell. The gaps between the pixels are filled with conductive polymer 306 to enhance ground bias of the p+ terminal of the p i n diodes as well as to allow light to strike on the sidewall of each cell.

As shown above, the invention produces a new photosensor pixel structure where the p+ diffusion of the p-i-n diode is formed along the vertical walls of a three-dimensional pixel island. Correspondingly, the n+ 106 of the p-i-n diode is formed in the core of the island, and the i layer 100B is the middle ring formed in between the outer edge of p+ layer 118B and the n+ core 106. By placing the light absorption regions along the vertical walls of the three-dimensional island, the area occupied by the light absorption regions is increased dramatically resulting in a substantial improvement in diode quantum efficiency.

As shown in FIGS. 12 and 13A, the light absorption regions are perpendicular to the upper surface of the pixel (as opposed to being parallel to the upper surface of the array, as is done conventionally). In other words, the light absorption sidewall regions are perpendicular to the surface of the pixel that receives the incident light, while conventional light absorption regions are made parallel to the pixel surface. With the invention, the upper surface of the island maintains the necessary logic circuitry and the upper surface is not a region where substantial amounts of light are absorbed. To the contrary, with the invention, the openings surrounding each pixel island allow angled light beams to directly strike the vertical light absorption surfaces. Further, light beams that are directly perpendicular to the upper surface of the array of are reflected from the trenches surrounding each of the islands to one of the adjacent vertical light absorption regions. Also, the light beams will produce multiple internal reflections inside the pixel island, which also improves the diode quantum efficiency.

Since the light absorption regions are perpendicular to the upper surface of the array, they do not consume any substantial amount of the two-dimensional area of the upper surface of the array. Only logic circuitry and the trenches between the pixel islands consume two-dimensional area of the upper surface of the array. Therefore, the inventive pixel islands only consume approximately 25% of the two-dimensional surface area of the upper surface of the array to provide the same amount of light absorption area of conventional horizontal light absorption regions. Thus, the inventive three-dimensional photo-diode island design realizes a 4× increase in sensor packing density.

While the invention has been described in terms of preferred embodiments, those skilled in the art will recognize that the invention can be practiced with modification within the spirit and scope of the appended claims.

What is claimed is:

1. A method of forming an island photodiode comprising:
   forming a core having a cube shape in a substrate;
   forming trenches in said substrate adjacent said core; and
   forming light sensing sidewalls along said trenches, wherein said sidewalls are perpendicular to a surface of said photodiode that receives incident light.

2. The method in claim 1, wherein said forming of said light sensing sidewalls comprises doping sidewalls of said trench to form a junction region between said sidewalls and said core that causes electron transfer when said sensing sidewalls are struck with light.

3. The method in claim 1 further comprising forming logic circuitry above said core, wherein said logic circuitry blocks light from reaching the top of said core.

4. The method in claim 1, wherein said forming of said trenches forms four vertical sidewalls around said core.

5. The method in claim 1, further comprising doping said core with impurities to form an n+ core and doping said sidewalls with impurities to form p+ sidewalls.

6. A method of forming an array of island photodiodes comprising:
   forming having a cube shape cores in a substrate;
   forming trenches in said substrate adjacent said cores; and
   forming light sensing sidewalls along said trenches, wherein said sidewalls are perpendicular to surfaces of said photodiodes that receive incident light.

7. The method in claim 6, wherein said forming of said light sensing sidewalls comprises doping sidewalls of said trench to form a junction region between said sidewalls and said cores that causes electron transfer when said sensing sidewalls are struck with light.

8. The method in claim 6, further comprising forming logic circuitry above said core, wherein said logic circuitry blocks light from reaching the top of said cores.

9. The method in claim 6, wherein said forming of said trenches forms four vertical sidewalls around each of said cores.

10. The method in claim 6, further comprising doping said cores with impurities to form an n+ core and doping said sidewalls with impurities to form p+ sidewalls.

11. A method of forming an island photodiode comprising:
   forming a core having a cube shape in a substrate;
   forming trenches in said substrate adjacent said core;
   forming light sensing sidewalls along said trenches, wherein said sidewalls are perpendicular to a surface of said photodiode that receives incident light; and
   forming logic circuitry above said core.

12. The method in claim 11, wherein said forming of said light sensing sidewalls comprises doping sidewalls of said trench to form a junction region between said sidewalls and said core that causes electron transfer when said sensing sidewalls are struck with light.

13. The method in claim 11, wherein said logic circuitry blocks light from reaching the top of said core.

14. The method in claim 11, wherein said forming of said trenches forms four vertical sidewalls around said core.

15. The method in claim 11, further comprising doping said core with impurities to form an n+ core and doping said sidewalls with impurities to form p+ sidewalls.

* * * * *